(12) United States Patent
Liu et al.

(10) Patent No.: US 9,066,417 B2
(45) Date of Patent: Jun. 23, 2015

(54) METHOD FOR MANUFACTURING PRINTED CIRCUIT BOARD

(71) Applicants:FuKui Precision Component (Shenzhen) Co., Ltd., Shenzhen (CN); Zhen Ding Technology Co., Ltd., Tayuan, Taoyuan (TW)

(72) Inventors: Rui-Wu Liu, Shenzhen (CN); Yu-Hsien Lee, New Taipei (TW); Wen-Hsin Yu, New Taipei (TW)

(73) Assignees: FuKui Precision Component (Shenzhen) Co., Ltd., Shenzhen (CH); Zhen Ding Technology Co., Ltd., Tayuan, Taoyuan (TW)

( * ) Notice: Subject to any disclaimer, the term of this patent is extended or adjusted under 35 U.S.C. 154(b) by 117 days.

(21) Appl. No.: 13/974,382

(22) Filed: Aug. 23, 2013

(65) Prior Publication Data

US 2014/0053397 A1 Feb. 27, 2014

(30) Foreign Application Priority Data

Aug. 27, 2012 (CN) .......................... 2012 1 0306666

(51) Int. Cl.
| | |
|---|---|
| *H05K 3/00* | (2006.01) |
| *H05K 3/36* | (2006.01) |
| *H05K 3/20* | (2006.01) |
| *H05K 1/00* | (2006.01) |
| *H05K 1/09* | (2006.01) |
| *B05D 3/00* | (2006.01) |
| *C08J 7/18* | (2006.01) |

(Continued)

(52) U.S. Cl.
CPC ........... *H05K 3/005* (2013.01); *Y10T 29/49124* (2013.01); *H05K 3/0032* (2013.01); *H05K 3/0052* (2013.01); *H05K 2201/09063* (2013.01); *H05K 2203/0346* (2013.01); *H05K 2203/107* (2013.01)

(58) Field of Classification Search
CPC ................... Y10T 29/49126; Y10T 29/49128; Y10T 29/4913; H05K 3/3452; H05K 1/092; H05K 3/244; H05K 3/061; H01L 2924/3011; C23C 14/28
USPC .................... 29/829, 830, 831; 174/250, 257; 427/554; 216/17
See application file for complete search history.

(56) References Cited

U.S. PATENT DOCUMENTS

| | | | | |
|---|---|---|---|---|
| 4,931,134 | A | * | 6/1990 | Hatkevitz et al. ............... 216/17 |
| 7,277,005 | B2 | * | 10/2007 | Kang et al. .................... 338/309 |
| 8,440,916 | B2 | * | 5/2013 | Li et al. ......................... 174/263 |

(Continued)

*Primary Examiner* — David Angwin
(74) *Attorney, Agent, or Firm* — Novak Druce Connolly Bove + Quigg LLP

(57) ABSTRACT

A method for manufacturing a PCB includes certain steps. A printed circuit board sheet is provided. The printed circuit board includes an unwanted portion and a printed circuit board unit which includes a plurality of contact pads. An imaginary boundary line is defined between the printed circuit board unit and the unwanted portion. Each of the contact pads defines an outline. A nearest distance between the outline and the imaginary boundary line is less than 4 millimeters. The printed circuit board sheet is punched along the imaginary boundary line, forming one hollow portion or a plurality of through slots. A plurality of burrs is generated on an inner surface of the hollow portion or the through slots. The burrs are removed using a low-energy laser cutting process, thereby obtaining a printed circuit board. A laser power used in the low-energy laser cutting process is 5-8 watts.

19 Claims, 10 Drawing Sheets

(51) Int. Cl.
*G21H 5/00* (2006.01)
*H01B 13/00* (2006.01)

(56) References Cited

U.S. PATENT DOCUMENTS

| | | | |
|---|---|---|---|
| 2001/0006117 A1* | 7/2001 | Cheng | 174/257 |
| 2002/0162214 A1* | 11/2002 | Hetherton et al. | 29/623 |
| 2002/0187318 A1* | 12/2002 | Yamashita et al. | 428/209 |
| 2005/0102807 A1* | 5/2005 | Takeuchi et al. | 29/25.35 |
| 2005/0188529 A1* | 9/2005 | Uriu et al. | 29/602.1 |
| 2006/0078013 A1* | 4/2006 | Chen | 372/22 |
| 2007/0089292 A1* | 4/2007 | Tourne et al. | 29/852 |
| 2007/0193680 A1* | 8/2007 | Umeoka et al. | 156/275.5 |
| 2008/0145567 A1* | 6/2008 | Ohmae et al. | 427/554 |
| 2008/0237204 A1* | 10/2008 | Ohmae et al. | 219/121.69 |
| 2010/0051321 A1* | 3/2010 | Murakami et al. | 174/250 |
| 2013/0299223 A1* | 11/2013 | Yoo et al. | 174/259 |
| 2014/0053397 A1* | 2/2014 | Liu et al. | 29/829 |
| 2014/0091072 A1* | 4/2014 | Mammila | 219/158 |
| 2014/0123486 A1* | 5/2014 | Jeong et al. | 29/829 |

* cited by examiner

METHOD FOR MANUFACTURING PRINTED CIRCUIT BOARD

BACKGROUND

1. Technical Field

The present disclosure relates to printed circuit boards, particularly to a method for manufacturing a printed circuit board.

2. Description of Related Art

Usually, a method for manufacturing a printed circuit board (PCB) includes the following processes. First, a PCB sheet including a PCB unit and an unwanted portion is provided. A plurality of contact pads is formed on the PCB unit. Imaginary boundary lines are defined between the PCB unit and the unwanted portion. Second, the PCB sheet is punched along the imaginary boundary lines. Thus, a plurality of through slots is forming between the PCB unit and the unwanted portion, and a plurality of interconnect links interconnect the PCB unit and the unwanted portion and separating the adjacent through slots. Third, a plurality of components is mounted on the contact pads of the PCB unit. Finally, the PCB unit is separated from the unwanted portion by punching the interconnect links, thereby obtaining a PCB.

However, a plurality of burrs will be formed at side portions of the PCB unit when punching the PCB sheet. When a nearest distance between a contact pad on the PCB unit and an edge of the PCB unit is less than 4 millimeters, the burrs may drop on the contact pad, resulting in a bad performance of the contact pad. A high-energy laser cutting method using a laser power of 8-15 watt is always applied instead of the punching method to prevent the generation of burrs. However, the surface of the contact pad may be oxidized by the high-energy laser beam because of the small nearest distance between the contact pad and the edge of the PCB sheet.

What is needed, therefore, is a method for manufacturing a printed circuit board that can overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

A method of manufacturing the printed circuit board will be described with reference to the drawings.

A method for manufacturing a PCB according to a first embodiment includes the following steps.

Figure 1:
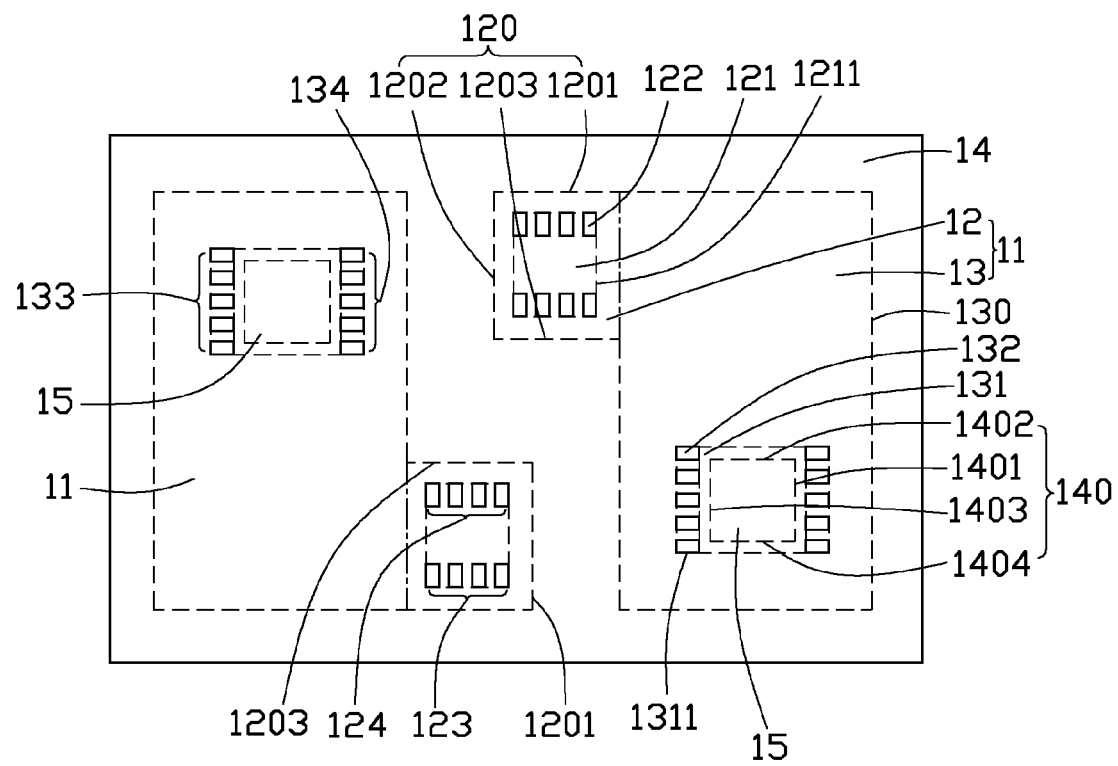
FIG. 1 is a plan view of a printed circuit board sheet including printed circuit board units and unwanted portions according to a first embodiment, imaginary boundary lines being defined between the printed circuit board units and the unwanted portions.

FIG. 1 shows that, in step (1), a PCB sheet 10 is provided.

In this embodiment, the PCB sheet 10 is rectangular. The PCB sheet 10 includes two PCB units 11, a first unwanted portion 14 and two second unwanted portions 15. The two PCB units 11 are surrounded by the first unwanted portion 14. The second unwanted portions 15 are defined in the PCB units 11.

In this embodiment, the PCB sheet 10 can be formed by a plurality of processes comprising a drilling process, a electrochemical deposition process, a photolithography process and an etching process.

The PCB unit 11 includes a first product portion 12 and a second product portion 13 connected to the first product portion 12.

The first product portion 12 is also rectangular. A first imaginary boundary line 120 is defined between the first product portion 12 and the first unwanted portion 14. The first imaginary boundary line 120 includes a first portion 1201, a second portion 1202 and a third portion 1203 sequentially connected in that order. The first portion 1201 is opposite to and parallel with the third portion 1203. The second portion 1202 is perpendicular to the first portion 1201 and the third portion 1203.

The first product portion 12 includes a first mounting region 121 for mounting an electronic component thereon or connecting to another electronic device such as a rigid motherboard. The first mounting region 121 is also rectangular. The first mounting region 121 includes a plurality of first contact pads 122. The first contact pads 122 are also rectangular. The first contact pads 122 are divided into two rows, a first contact pad row 123 and a second contact pad row 124. Each of the first and second contact pad rows 123 and 124 includes a plurality of the first contact pads 122. The first contact pads 122 can be formed by a gold-plating process. Each of the first contact pads 122 defines a first outline 1211.

In this embodiment, a distance between the first portion 1201 of the first imaginary boundary line 120 and a portion of the first outline 1211 adjacent to and parallel with the first portion 1201 is less than 4 millimeters. A distance between the second portion 1202 of the first imaginary boundary line 120 and a portion of the first outline 1211 adjacent to and parallel with the second portion 1202 is less than 4 millimeters. A distance between the third portion 1203 of the first imaginary boundary line 120 and a portion of the first outline 1211 adjacent to and parallel with the third portion 1203 is less than 4 millimeters. In other words, the nearest distance between the first outline 1211 and the first imaginary boundary line 120 is less than 4 millimeters.

In another embodiment, the number of the first contact pads 122 can be only one. The first product portion 12, the first mounting region 121 and the first contact pad 122 can also be other shapes, such as round, square, or an irregular shape.

The second product portion 13 is rectangular. A second imaginary boundary line 130 is defined between the second product portion 13 and the first unwanted portion 14. One end of the first portion 1201 and the third portion 1203 abuts on the second imaginary boundary line 130. The two second unwanted portions 15 are surrounded by the second imaginary boundary line 130. The second unwanted portion 15 has a third imaginary boundary line 140. The third imaginary boundary line 140 includes a fourth portion 1401, a fifth portion 1402, a sixth portion 1403 and a seventh portion 1404 sequentially connected end to end in that order. The fourth portion 1401 is parallel to the sixth portion 1403. The fifth portion 1402 is parallel to the seventh portion 1404.

The second product portion 13 includes a second mounting region 131 for mounting an electronic component thereon or connecting to another electronic device such as a rigid motherboard. The second mounting region 131 is also rectangular. The second mounting region 131 includes a plurality of second contact pads 132. The second contact pads 132 are also rectangular. The second contact pads 132 are divided into two rows, a third contact pad row 133 and a fourth contact pad row 134. Each of the third and fourth contact pad rows 133 and 134 includes a plurality of the second contact pads 132. The second contact pads 132 can be formed by a gold-plating process. Each of the second contact pads 132 defines a second outline 1311.

In this embodiment, a distance between the fourth portion 1401 of the third imaginary boundary line 140 and a portion of the second outline 1311 adjacent to and parallel with the fourth portion 1401 is less than 4 millimeters. A distance between the fifth portion 1402 of the third imaginary boundary line 140 and a portion of the second outline 1311 adjacent to and parallel with the fifth portion 1402 is less than 4 millimeters. A distance between the sixth portion 1403 of the third imaginary boundary line 140 and a portion of the second outline 1311 adjacent to and parallel with the sixth portion 1403 is less than 4 millimeters. A distance between the seventh portion 1404 of the third imaginary boundary line 140 and a portion of the second outline 1311 adjacent to and parallel with the seventh portion 1404 is less than 4 millimeters. In other words, the nearest distance between the second outline 1311 and the third imaginary boundary line 140 is less than 4 millimeters.

In another embodiment, the number of the second contact pads 132 can be only one. The second product portion 13, the second mounting region 131 and the second contact pad 132 can also be other shapes, such as round or square.

In an alternative embodiment, the first product portion 12 or the second product portion 13 can be omitted. The PCB sheet 10 can include just one PCB unit 11, a first unwanted portion 14 and a second unwanted portion 15. The PCB sheet 10 can also include more than two PCB units 11, and more than two second unwanted portions 15.

Figure 2:
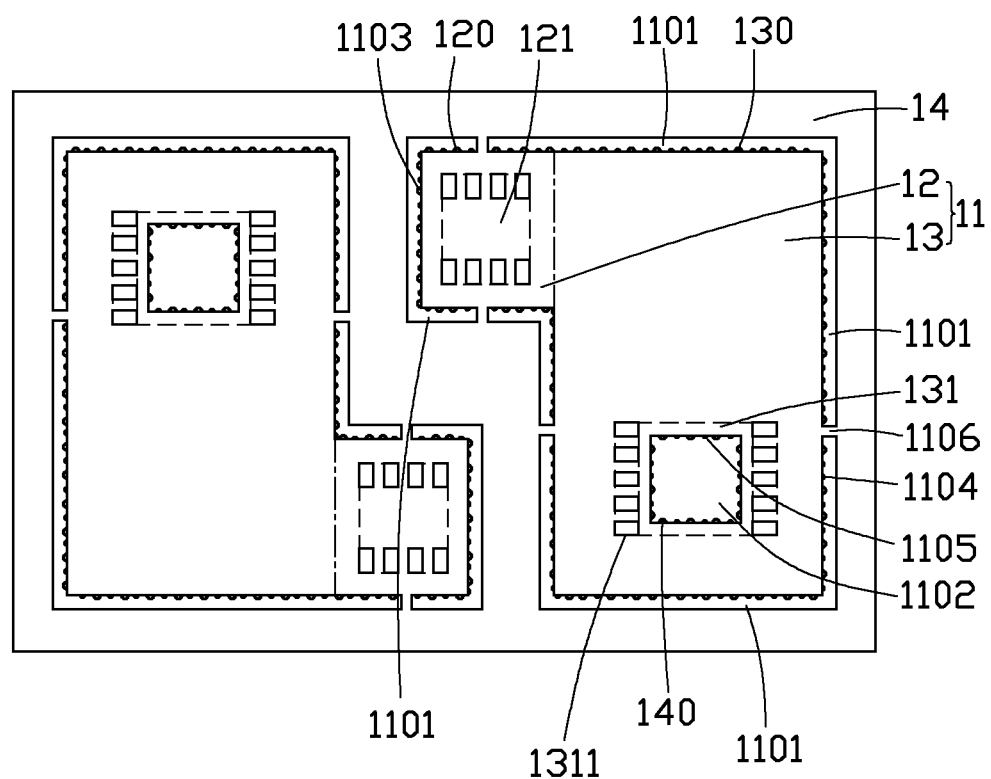
FIG. 2 shows that a plurality of through slots and hollow portions formed by punching the printed circuit board sheet along the imaginary boundary lines.

FIG. 2 shows that, in step (2), the PCB sheet 10 is punched along the first imaginary boundary lines 120, the second imaginary boundary lines 130, and the third imaginary boundary lines 140, thereby forming a plurality of through slots 1101 along the first and second imaginary boundary lines 120 and 130, and two hollow portions 1102 are surrounded by the two third imaginary boundary lines 140. The through slots 1101 are separated by a plurality of interconnect links 1106 interconnecting the first unwanted portion 14, and the first product portion 12 and the second product portion 13.

A plurality of first burrs 1103 and second burrs 1104 are generated on an inner surface of the through slots 1101, and a plurality of third burrs 1105 are generated on an inner surface of the hollow portions 1102 during the punching process. The first burrs 1103 are positioned on an inner surface of the through slots 1101 corresponding to the first imaginary boundary lines 120. The second burrs 1104 are positioned on an inner surface of the through slots 1101 corresponding to the second imaginary boundary lines 130.

The punching process is a process that punches a PCB along a boundary of the PCB by a punching die.

Figure 3:
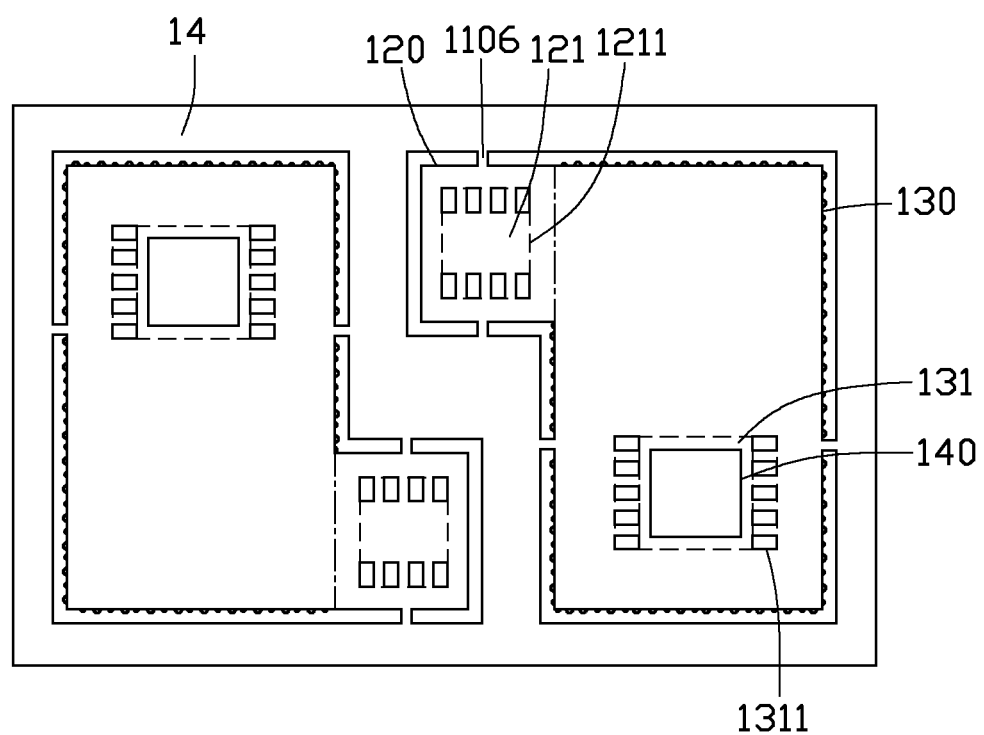
FIG. 3 is a plan view of a printed circuit board assembly obtained by removing the burrs in FIG. 2 using a low-energy laser cutting process.

FIG. 3 shows that, in step (3), the first burrs 1103 and the third burrs 1105 are removed using a low-energy laser cutting process, thereby obtaining a PCB assembly 20, free of the burrs around the contact pads which have a nearest distance of less than 4 millimeters to the imaginary boundary line.

The removed first burrs 1103 are those corresponding to the first imaginary boundary line 120 which has a distance of less than 4 millimeters to the first outline 1211. The removed third burrs 1105 are those corresponding to the portion of the third imaginary boundary line 140 which has a distance of less than 4 millimeters to the second outline 1311.

A laser power used in the low-energy laser cutting process is 5-8 watts. A laser pulse frequency used in the low-energy laser cutting process is 80 kilohertz (kHz). A laser wavelength used in the low-energy laser cutting process is 355 nm. A cutting-speed of the low-energy laser cutting process is in the range from 100 mm/s to 200 mm/s The burrs are cut 2-8 times in the low-energy laser cutting process.

In an alternative embodiment, the second burrs 1104 can also be removed using the low-energy laser cutting process if a nearest distance between the second outline 1311 and the second imaginary boundary line 130 is less than 4 millimeters.

Usually, gum residue will be generated after the low-energy laser cutting process. The gum residue can be removed using a plasma desmearing process or a chemical desmearing process after the low-energy laser cutting process.

Figure 4:
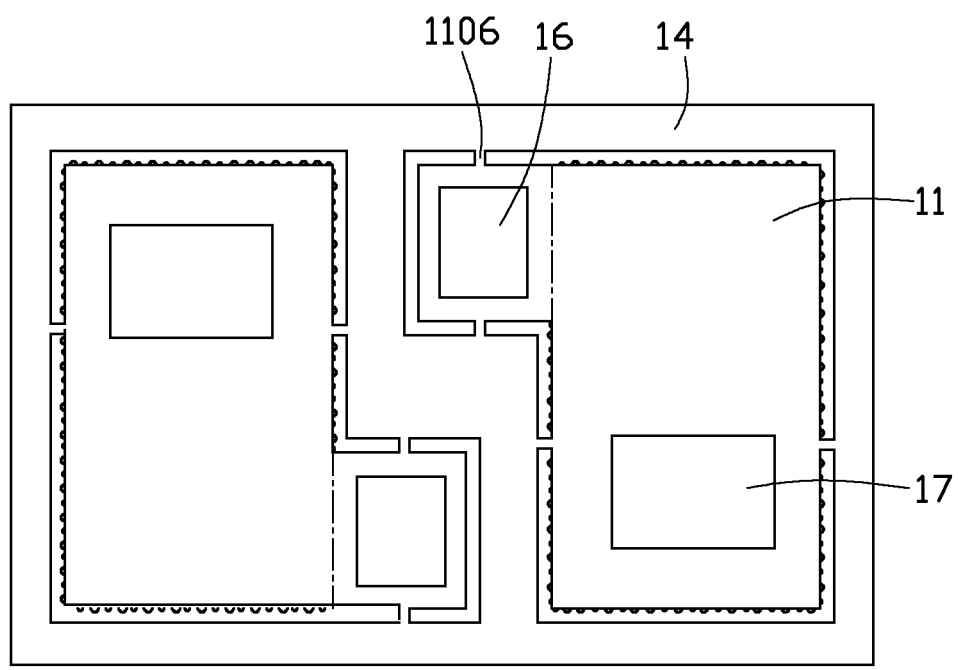
FIG. 4 shows components mounted on contact pads of the printed circuit board assembly.

FIG. 4 shows that, in step (4), a first component 16 is mounted on the first mounting region 121 and a second component 16 is mounted on the second mounting region 131, thereby obtaining a PCB assembly 30. In another embodiment, step (4) can be omitted.

Figure 5:
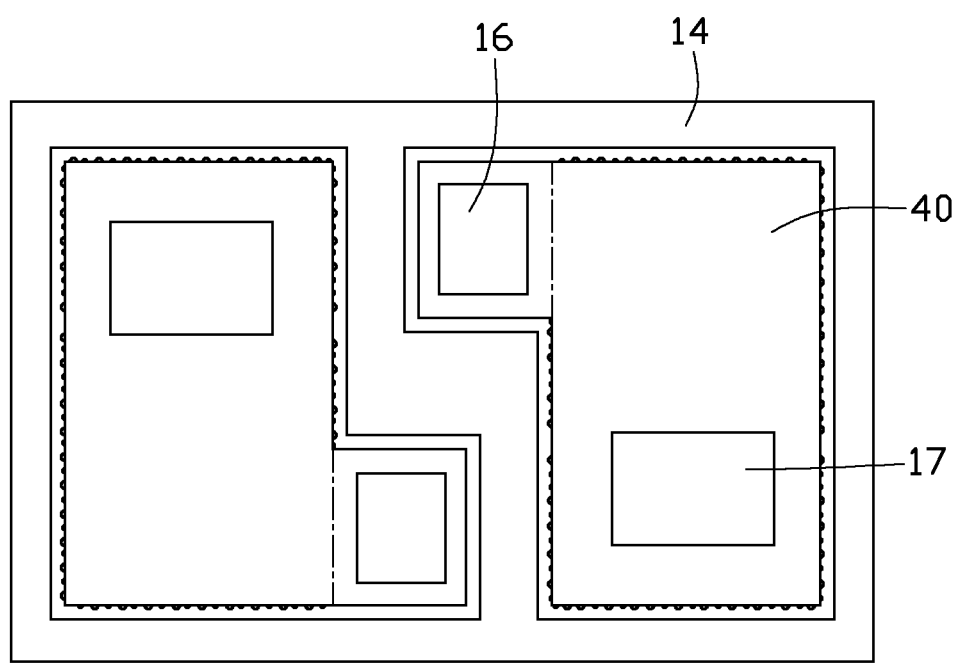
FIG. 5 is a plan view of the printed circuit board obtained by punching the interconnect links in FIG. 4.

FIG. 5 shows that, in step (5), the interconnect links 1106 are punched, thereby separating the first unwanted portion 14 from the PCB units 11. Thus, two separated PCBs 40 are obtained. In this embodiment, the interconnect links 1106 are removed.

Because the burrs around the contact pads are removed using the low-energy laser cutting process, the contact pads are not oxidized by laser beam. When mounting a component on the contact pads, no burrs are present on the contact pads. Thus, the electrical conductivity between the component and the contact pads is better.

A method for manufacturing a printed circuit board according to a second embodiment includes the following steps.

Step 1 of this embodiment is same as step (1) of the first embodiment.

Figure 6:
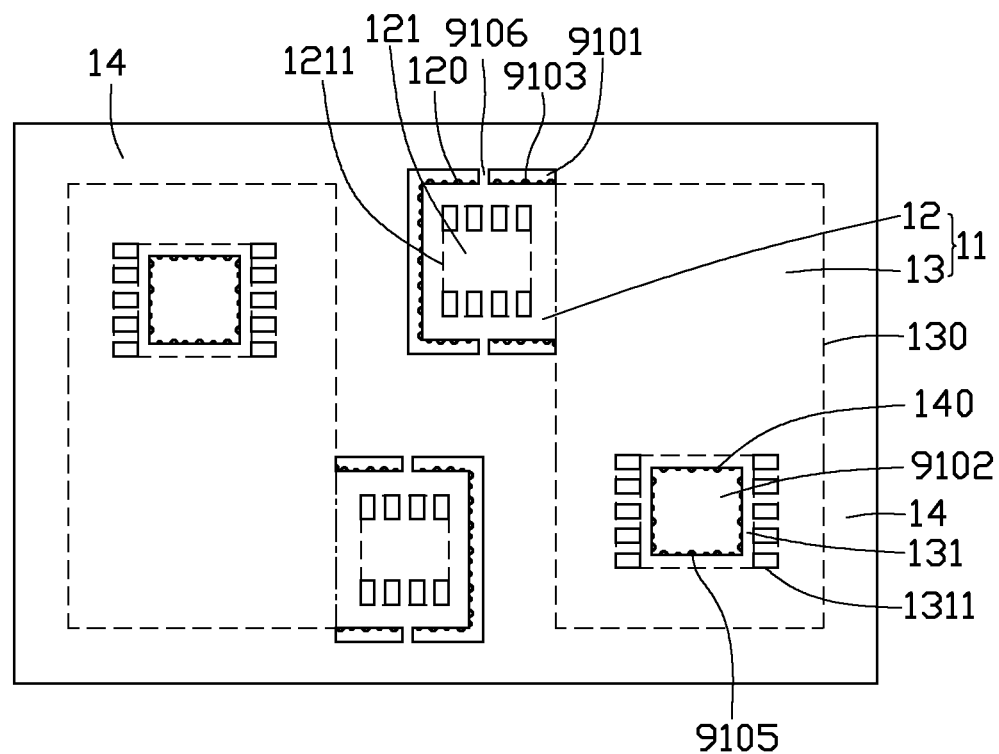
FIG. 6 shows first through slots and hollow portions formed by punching the printed circuit board sheet of FIG. 1 along the imaginary boundary lines surrounding the contact pads.

FIG. 6 shows that, in step 2, the PCB sheet 10 is punched along the first imaginary boundary line 120 and the third imaginary boundary lines 140, thereby forming a plurality of first through slots 9101 along the first imaginary boundary lines 120, and two hollow portions 9102 are surrounded by the two third imaginary boundary lines 140. The first through slots 9101 are separated by a plurality of first interconnect links 9106 interconnecting the first unwanted portion 14 and the first product portion 12. A plurality of first burrs 9103 are generated on an inner surface of the first through slots 9101, and a plurality of second burrs 9105 are generated on an inner surface of the hollow portions 9102 during the punching process.

That is to say, the printed circuit board sheet 10 is punched along a section of the imaginary boundary lines adjacent to the contacts pads. A nearest distance between the section of the imaginary boundary lines and the outline of the contact pads are less than 4 millimeters. The punching process is a process that punches a PCB along a boundary of the PCB by a punching die.

Figure 7:
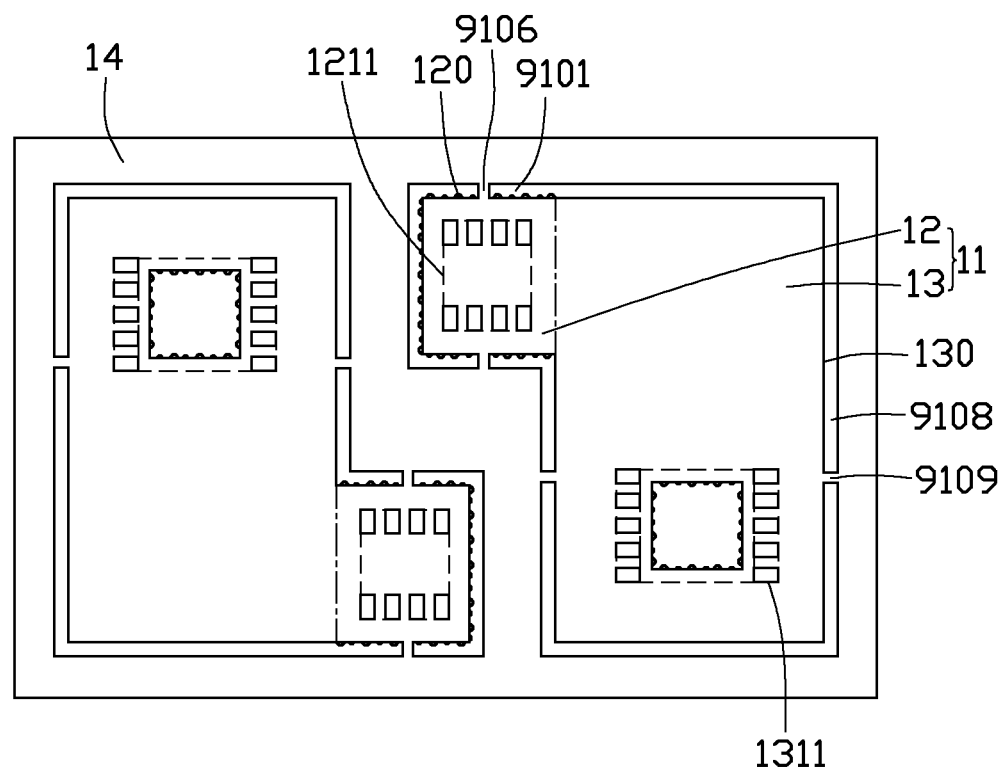
FIG. 7 shows that a plurality of second through slots formed by cutting the printed circuit board sheet of FIG. 6 along the imaginary boundary lines using a high-energy laser beam.

FIG. 7 shows that, in step 3, the PCB sheet 10 is cut using a high-energy laser beam along the second imaginary boundary line 130, thereby forming a plurality of second through slots 9108. The second through slots 9108 are separated by a plurality of second interconnect links 9109 interconnecting the first unwanted portion 14 and the second product portion 13.

That is to say, the printed circuit board sheet 10 is cut along a section of the imaginary boundary lines adjacent to the contacts pads. The section is spaced a distance of equal to 4 millimeters or greater than 4 millimeters from the contact pads. A laser power used in the high-energy laser cutting process is 8-15 watts. A laser pulse frequency used in the high-energy laser cutting process is 80 kHz. A laser wavelength used in the high-energy laser cutting process is 355 nm. A cutting-speed of the low-energy laser cutting process is in the range from 100 mm/s to 200 mm/s. The PCB sheet 10 is cut 10-20 times in the high-energy laser cutting process.

Figure 8:
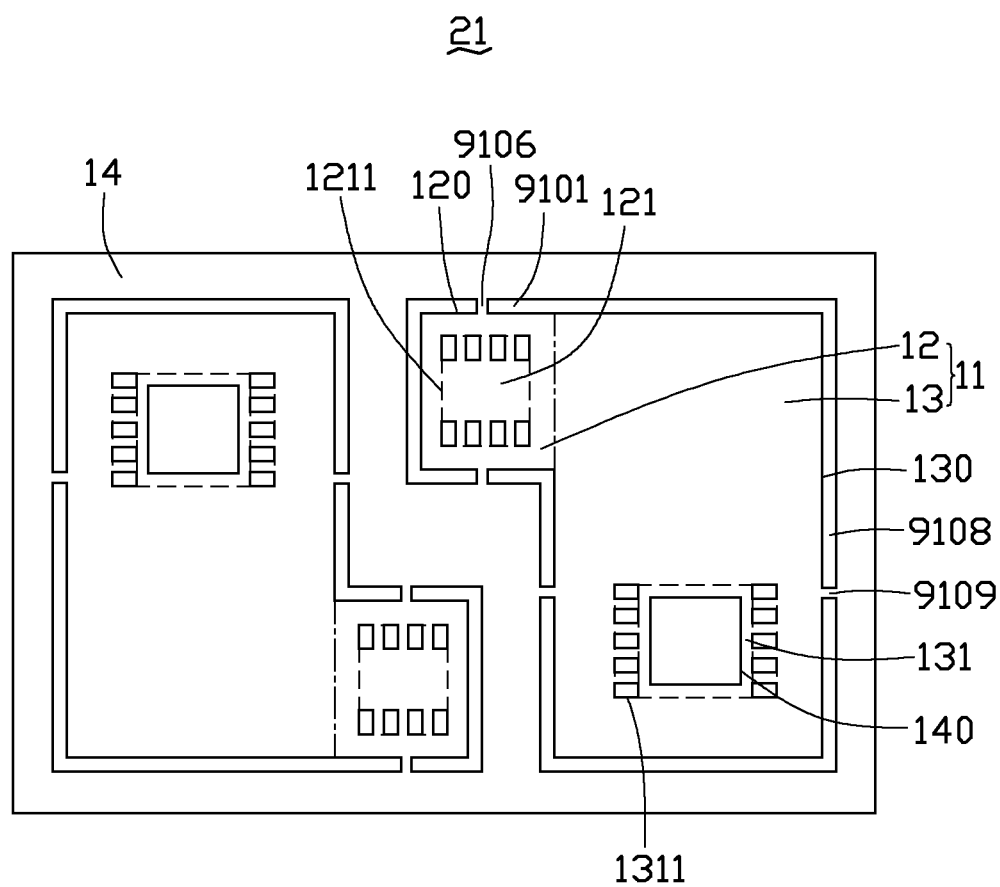
FIG. 8 is a plan view of a printed circuit board assembly obtained by removing the burrs in FIG. 7 using a low-energy laser cutting process.

FIG. 8 shows that, in step 4, the first burrs 9103 and the second burrs 9105 are removed using a low-energy laser cutting process, thereby obtaining a PCB assembly 21, free of the burrs around the contact pads which have a nearest distance of less than 4 millimeters to the imaginary boundary line.

The removed first burrs 9103 are those corresponding to the first imaginary boundary line 120 which has a distance of less than 4 millimeters to the first outline 1211. The removed second burrs 9105 are those corresponding to the third imaginary boundary line 140 which has a distance of less than 4 millimeters to the second outline 1311.

A laser power used in the low-energy laser cutting process is 5-8 watts. A laser pulse frequency used in the low-energy laser cutting process is 80 kHz. A laser wavelength used in the low-energy laser cutting process is 355 nm. A cutting-speed of the low-energy laser cutting process is in the range from 100 mm/s to 200 mm/s. The burrs are cut 2-8 times in the low-energy laser cutting process.

Usually, gum residue will be generated after the high-energy laser cutting process and the low-energy laser cutting process. The gum residue can be removed using a plasma desmearing process or a chemical desmearing process after the low-energy laser cutting process.

Figure 9:
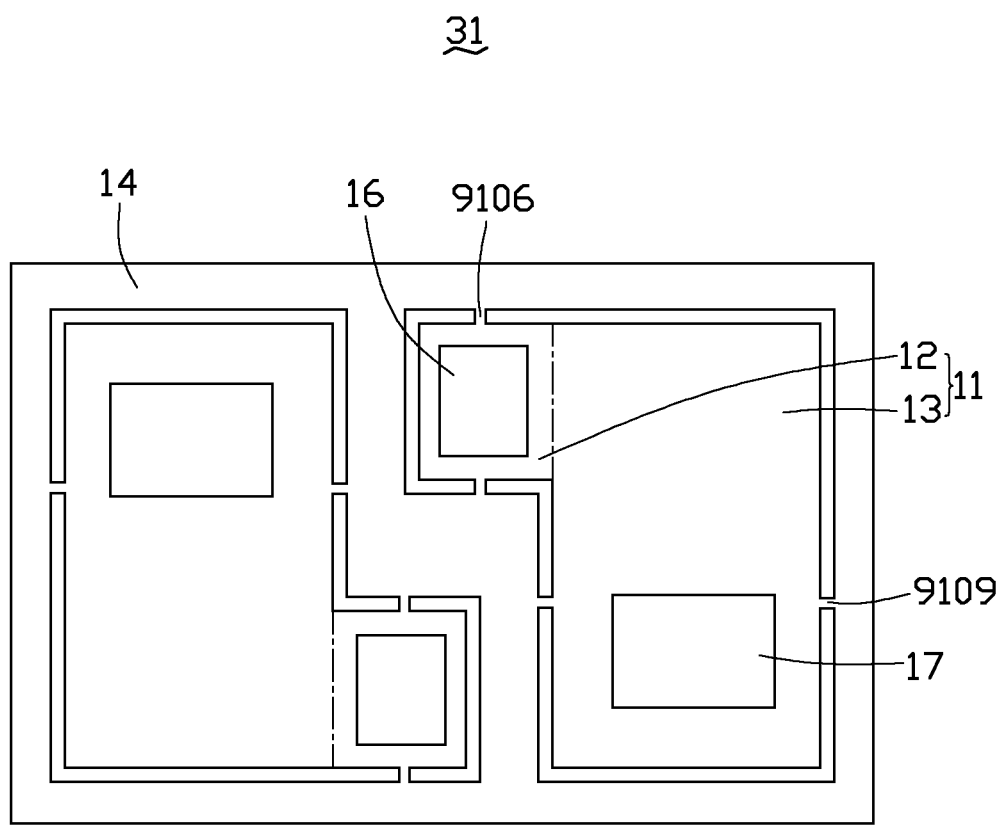
FIG. 9 shows components mounted on contact pads of the printed circuit board assembly of FIG. 8.

FIG. 9 shows that, in step 5, a first component 16 is mounted on the first mounting region 121 and a second component 16 is mounted on the second mounting region 131, thereby obtaining a PCB assembly 31.

Figure 10:
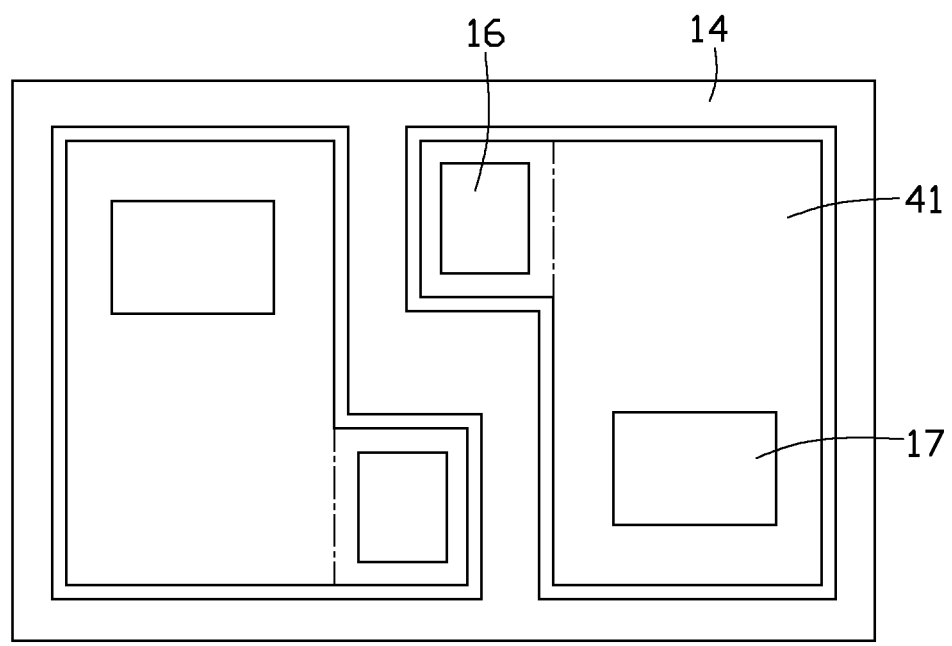
FIG. 10 is a plan view of the printed circuit board obtained by punching the interconnect links in FIG. 9.

FIG. 10 shows that, in step 6, the first interconnect links 9106 and the second interconnect links 9109 are punched, thereby separating the first unwanted portion 14 from the PCB units 11. Thus, two separated PCBs 40 are obtained. In this embodiment, the first interconnect links 9106 and the second interconnect links 9109 are removed.

Because the burrs around the contact pads are removed using the low-energy laser cutting process, the contact pads are not oxidized by laser beam. When mounting a component on the contact pads, no burrs are present on the contact pads. Thus the electrical conductivity between the component and the contact pads is better.

While certain embodiments have been described and exemplified above, various other embodiments will be apparent to those skilled in the art from the foregoing disclosure. The present disclosure is not to be limited to the particular embodiments described and exemplified but is capable of considerable variation and modification without departure from the scope of the appended claims.

What is claimed is:

1. A method for manufacturing a printed circuit board, comprising:
   providing a printed circuit board sheet comprising a printed circuit board unit and a unwanted portion, an imaginary boundary line being defined between the printed circuit board unit and the unwanted portion, the printed circuit board unit including a plurality of contact pads, each of the contact pads defining an outline, a nearest distance between the outline and the imaginary boundary line being less than 4 millimeters;
   punching the printed circuit board sheet along the imaginary boundary line, thereby forming one hollow portion or a plurality of through slots, with a plurality of burrs being generated on an inner surface of the hollow portion or the through slots during the punching process; and
   removing the burrs around the contact pads using a low-energy laser cutting process along the imaginary boundary line, thereby obtaining a printed circuit board, free of the burrs around the contact pads which has a nearest distance of less than 4 millimeters to the imaginary boundary line, a laser power used in the low-energy laser cutting process being 5-8 watts.

2. The method of claim 1, wherein the burrs are cut 2-8 times in the low-energy laser cutting process, a laser pulse frequency used in the low-energy laser cutting process being 80 kilo hertz, a laser wavelength used in the low-energy laser cutting process being 355 nm, a cutting-speed of the low-energy laser cutting process being in the range from 100 mm/s to 200 mm/s.

3. The method of claim 1, wherein the printed circuit board unit is surrounded by the unwanted portion, the through slots are formed when punching the printed circuit board sheet along the imaginary boundary line.

4. The method of claim 3, wherein a plurality of interconnect links interconnect the unwanted portion and the printed circuit board unit and separating the adjacent through slots.

5. The method of claim 4, further comprising punching the interconnect links after the step of removing the burrs around the contact pads, thereby separating the unwanted portion from the printed circuit board unit.

6. The method of claim 1, wherein the unwanted portion is located within the printed circuit board unit, and the hollow portion is formed when punching the printed circuit board sheet along the imaginary boundary line.

7. A method for manufacturing a printed circuit board, comprising:
   providing a printed circuit board sheet comprising a printed circuit board unit and a unwanted portion, an imaginary boundary line being defined between the printed circuit board unit and the unwanted portion, the printed circuit board unit including a plurality of contact pads, each of the contact pads defining an outline, a nearest distance between the outline and the imaginary boundary line being less than 4 millimeters;

punching the printed circuit board sheet along the imaginary boundary line, thereby forming one hollow portion or a plurality of through slots, with a plurality of burrs being generated on an inner surface of the hollow portion or the through slots during the punching process; and removing the burrs using a low-energy laser cutting process, thereby obtaining a printed circuit board, a laser power used in the low-energy laser cutting process being 5-8 watts.

8. The method of claim 7, wherein the burrs are cut 2-8 times in the low-energy laser cutting process, a laser pulse frequency used in the low-energy laser cutting process being 80 kilo hertz, a laser wavelength used in the low-energy laser cutting process being 355 nm, a cutting-speed of the low-energy laser cutting process being in the range from 100 mm/s to 200 mm/s.

9. The method of claim 7, wherein the printed circuit board unit is surrounded by the unwanted portion, the through slots are formed when punching the printed circuit board sheet along the imaginary boundary line.

10. The method of claim 9, wherein a plurality of interconnect links interconnect the unwanted portion and the printed circuit board unit and separating the adjacent through slots.

11. The method of claim 10, further comprising punching the interconnect links after the step of removing the burrs, thereby separating the unwanted portion from the printed circuit board unit.

12. The method of claim 7, wherein the unwanted portion is located within the printed circuit board unit, and the hollow portion is formed when punching the printed circuit board sheet along the imaginary boundary line.

13. A method for manufacturing a printed circuit board, comprising:

providing a printed circuit board sheet comprising a printed circuit board unit and a unwanted portion, an imaginary boundary line being defined between the printed circuit board unit and the unwanted portion, the printed circuit board unit including a plurality of contact pads, each of the contact pads defining an outline, a nearest distance between the outline and the imaginary boundary line being less than 4 millimeters;

the imaginary boundary line including a first section adjacent to the contact pads and a second section spaced a distance of equal to 4 millimeters or greater than 4 millimeters from the contact pads, punching the printed circuit board sheet along the first section of the imaginary boundary line, thereby forming one hollow portion or a plurality of first through slots, a nearest distance between the first section and the outline of the contact pads being less than 4 millimeters, a plurality of burrs being generated on inner surfaces of the hollow portion or the first through slots during the punching process;

cutting the printed circuit board sheet using a high-energy laser beam along the second section of the imaginary boundary line thereby forming a plurality of second through slots, a laser power used in the high-energy laser cutting process being 8-15 watts; and removing the burrs around the contact pads using a low-energy laser cutting process, thereby obtaining a printed circuit board, a laser power used in the low-energy laser cutting process being 5-8 watts.

14. The method of claim 13, wherein the burrs are cut 2-8 times in the low-energy laser cutting process, a laser pulse frequency used in the low-energy laser cutting process being 80 kilo hertz, a laser wavelength used in the low-energy laser cutting process being 355 nm, a cutting-speed of the low-energy laser cutting process being in the range from 100 mm/s to 200 mm/s.

15. The method of claim 13, wherein the printed circuit board sheet are cut 10-20 times in the high-energy laser cutting process, a laser pulse frequency used in the high-energy laser cutting process being 80 kilo hertz, a laser wavelength used in the high-energy laser cutting process being 355 nm, a cutting-speed of the high-energy laser cutting process being in the range from 100 mm/s to 200 mm/s.

16. The method of claim 13, wherein the printed circuit board unit is surrounded by the unwanted portion, the first through slots are formed when punching the printed circuit board sheet along the imaginary boundary line.

17. The method of claim 16, wherein a plurality of first interconnect links interconnect the unwanted portion and the printed circuit board unit and separating the adjacent first through slots, a plurality of second interconnect links interconnecting the unwanted portion and the printed circuit board unit and separating the adjacent second through slots.

18. The method of claim 17, further comprising punching the first and the second interconnect links after the step of removing the burrs around the contact pads, thereby separating the unwanted portion from the printed circuit board unit.

19. The method of claim 13, wherein the unwanted portion is located within the printed circuit board unit, and the hollow portion is formed when punching the printed circuit board sheet along the imaginary boundary line.

* * * * *